(12) United States Patent
Påtz

(10) Patent No.: US 6,283,542 B1
(45) Date of Patent: Sep. 4, 2001

(54) SOLAR COVER OF AN OPENABLE MOTOR VEHICLE ROOF AND PROCESS FOR ITS PRODUCTION

(75) Inventor: Werner Påtz, Hofstetten (DE)

(73) Assignee: Webasto Systemkomponenten GmbH, Stockdorf (DE)

( * ) Notice: Subject to any disclaimer, the term of this patent is extended or adjusted under 35 U.S.C. 154(b) by 0 days.

(21) Appl. No.: 09/302,297

(22) Filed: Apr. 30, 1999

(30) Foreign Application Priority Data

| May 2, 1998 | (DE) | ................................................ | 198 19 679 |
| May 2, 1998 | (DE) | ................................................ | 198 19 680 |

(51) Int. Cl.$^7$ ............................................................ B60J 7/04
(52) U.S. Cl. ......................................... 296/211; 296/216.09
(58) Field of Search ............................... 296/211, 216.06, 296/216.09

(56) References Cited

U.S. PATENT DOCUMENTS

| 4,509,791 | * | 4/1985 | Bienert et al. | ................... 296/216.09 |
| 4,891,913 | * | 1/1990 | Shimura et al. | ............ 296/216.09 X |
| 4,971,308 | * | 11/1990 | Herlemann et al. | ................. 296/221 |
| 5,466,508 | * | 11/1995 | Brocke et al. | .............. 296/216.09 X |

FOREIGN PATENT DOCUMENTS

| 85 35 648 | 3/1986 | (DE) . |
| 40 20 655 | 5/1991 | (DE) . |
| 40 06 756 | 9/1991 | (DE) . |
| 197 39 615 | 12/1998 | (DE) . |
| 282020 | * 11/1989 | (JP) ..................................... 296/211 |
| 404306126 | * 10/1992 | (JP) ..................................... 296/211 |

* cited by examiner

*Primary Examiner*—Dennis H. Pedder
(74) *Attorney, Agent, or Firm*—Nixon Peabody LLP; David S. Safran

(57) ABSTRACT

A solar cover of an openable motor vehicle roof with a transparent cover panel (1) which is surrounded in the edge area at least in part by a plastic frame (2), with a solar cell network (9) which is provided on the inside of the cover panel (1) and which extends into the vicinity of the cover panel edge area, and with an inside cover sheet (3) which is located in the cover panel edge area and which overlaps the solar cell network (9) with its inside edge. To prevent load application by the inner cover sheet (3) to the solar cell network (9) which leads to delamination the inside edge (7) of the inner cover sheet (3) is located in a noncontacting, overly relationship with respect to the solar cell network (9). Furthermore, the cover sheet (3) is connected by means of adhesive securely to the combination of the cover panel (1) and the plastic frame (2).

13 Claims, 4 Drawing Sheets

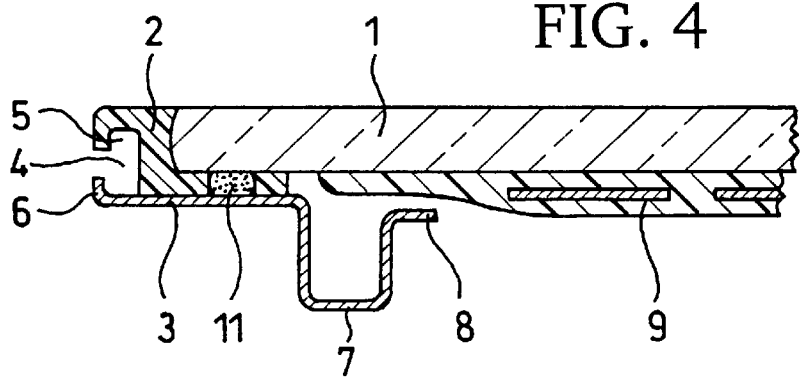
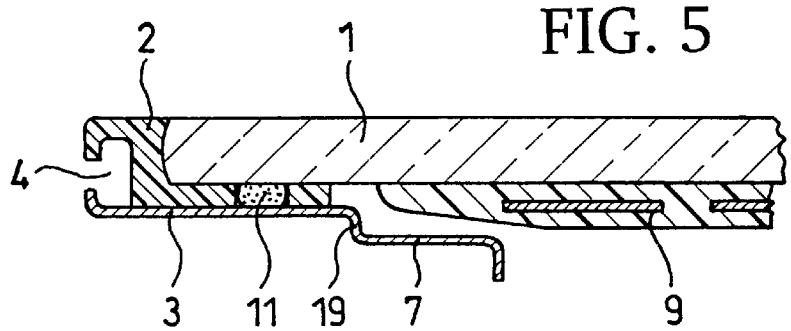
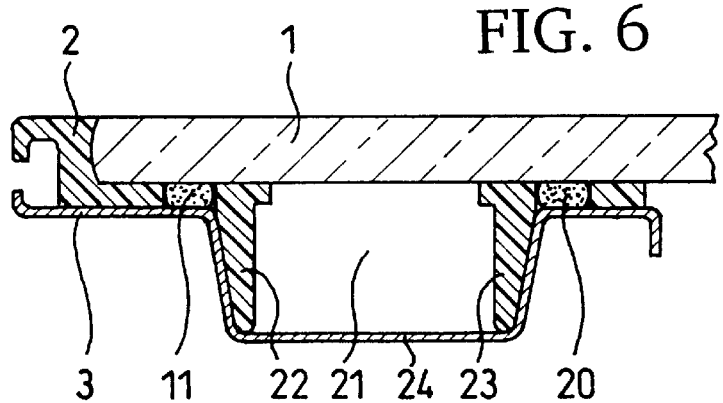

SOLAR COVER OF AN OPENABLE MOTOR VEHICLE ROOF AND PROCESS FOR ITS PRODUCTION

BACKGROUND OF THE INVENTION

1. Field of Invention

The invention relates to a solar cover of an openable motor vehicle roof with a transparent cover panel which is at least partially surrounded in the edge area by a plastic frame, and which is provided with a solar cell network on the inside of the cover panel which extends into the vicinity of the cover panel edge area, and with an inner cover sheet which is located in the cover panel edge area and which overlaps the solar cell network with its inside edge. The invention also relates to a process for producing such a solar cover.

2. Description of Related Art

A solar cover of the above-mentioned type is known, for example, from German Patent No. DE 40 20 655 C1. In this known solar cover, the outside edge of the inner cover sheet is integrated into the plastic frame; this requires that the inner cover sheet is already attached to the inside of the cover panel when the plastic frame is connected thereto, for example, by foaming on. This is relatively complex. The problem in this known solar cover is, moreover, that the solar cell network extends into the area of the inside of the cover panel that is surrounded by the inner cover sheet which, in this area, is in contact with the solar cell network. This loads the network in a manner detrimental to the endurance strength of the solar cover, since application of a load to the solar cell network over the long run leads to delamination of this network.

Another laminate composite glass pane with embedded solar cells is known from DE-U1 85 35 648.

SUMMARY OF THE INVENTION

In view of this prior art, a primary object of the present invention is to devise a solar cover of the initially mentioned type which can be easily produced and which ensures a long service life without adversely affecting the solar cell network.

In addition, it is a further object to provide a process for easily producing the inventive cover.

These objects are achieved with respect to the solar cover by a gap being left between the inside edge of the inner cover sheet and the solar cell network so that the inside edge of the inner cover sheet remains disengaged from the solar cell network. Furthermore, optionally, the inner cover sheet is securely connected by means of adhesive to the combination of the cover panel and the plastic frame.

These objects are achieved with respect to the process for production of the solar cover by, first of all, the plastic frame being molded to the edge area of the cover before the solar cell network is applied to the inside of the cover, and then the inner cover sheet being cemented to the combination of cover and plastic frame, optionally with contact-free overlapping of the solar cell network.

The core of the invention is accordingly formed by contact-free overlapping of the solar cell network by the inner cover sheet. This contact-free overlapping ensures the endurance strength of the solar cover since, in contrast to the prior art, no forces which lead to delamination of the solar cell network over the long term are applied to the solar cells by the inner cover sheet. On the other hand, the overlapping ensures a sufficiently large useful surface for the solar cell network so that the attainable solar power measured on the surface of the cover is optimum.

According to one advantageous development of the invention, the inside edge of the inner cover sheet, in the solar cell network overlapping area, follows the contour of the overlapped area of the solar cell network in order to ensure as small as possible a structural height of the solar cover in the edge area.

Another key aspect of the invention involves the provision of an adhesive connection of the inner cover sheet to the combination of the cover panel and the plastic frame such that contact between the inner cover sheet and the solar cell network is prevented. The adhesive connection of the inner cover sheet to the combination of the cover panel and the plastic frame, at the same time, enables simplified manufacture of the solar cover because, after completion of the combination of the cover panel and plastic frame, the solar cell network can be laminated onto the inside of the cover panel before attachment of the inner cover sheet without adversely affecting the rubber mat which is necessary for this lamination process, because the plastic frame in the area of its bottom can be made almost as flat as desired. Only after laminating the solar cell network onto the inside of the cover is the inner cover sheet adhesively connected.

The plastic frame can be made so thin that it provides tolerance equalization for the cover panel edge. One advantage of this thin design of the plastic frame is relatively low consumption of the corresponding plastic material, preferably foamable polyurethane. The plastic frame adheres to the cover panel only over the width necessary for the strength of the cover panel.

In the plastic frame, there is advantageously at least one recess that is open towards the adjoining inner cover sheet for holding the adhesive that joins it to the inner cover sheet. This is done by applying and holding the adhesive in the required thickness in a defined manner. Furthermore, it is advantageously provided that, inwardly from the plastic frame on the inside of the cover, an adhesive bead is applied for joining the inner cover sheet to the inside of the cover. This measure makes it possible to connect a wider inner cover sheet to the inside of the cover panel in a stable manner, while insuring that the inner cover sheet is spaced away from the inside of the cover panel far enough to prevent contact between the inner cover sheet and solar cell network.

Advantageously, in the plastic frame, in addition to the recesses for holding the adhesive there can be depressions or openings to border the channels or cavities which are used to hold electric lines or components.

The process for producing the above described solar cover in accordance with the invention is based on the above described adhesive connection between the inner cover sheet and the combination of the cover panel and plastic fame in which, after completion of the combination of the cover panel and plastic frame, the solar cell network can be laminated onto the inside of the cover panel before attachment of the inner cover sheet without adversely affecting the rubber mat which is necessary for this lamination process, because the plastic frame in the area of its bottom can be made almost as flat as desires. Only after laminating the solar cell network onto the inside of the cover is the inner cover sheet adhesively joined such that its inside edge overlaps the solar cell network without contact.

These and further objects, features and advantages of the present invention will become apparent from the following description when taken in connection with the accompany-

BRIEF DESCRIPTION OF THE DRAWINGS

FIG. 4 shows a version of the FIG. 1 embodiment without a cover film;

FIG. 5 shows a version of the FIG. 2 embodiment without a cover film;

FIG. 6 is a sectional view of the combination of the cover panel and plastic frame of the solar cover in the receiving area for an electronic component assigned to the solar cover.

DETAILED DESCRIPTION OF THE INVENTION

Figure 1:
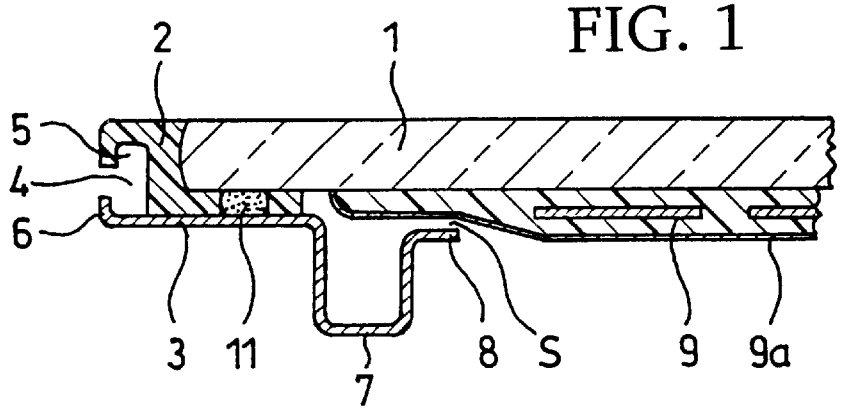
FIG. 1 shows a partial cross section of a first embodiment of a solar cover in the edge area.

As shown in FIG. 1, the solar cover of an openable motor vehicle roof made in accordance with the invention comprises a transparent cover panel 1, for example, of single pane of safety glass, which is surrounded in the edge area by a plastic frame 2. The material of the plastic frame is preferably polyurethane which is foamed onto the edge of the cover panel 1 during the production which is explained in detail below. In addition, the solar cover comprises an inner cover sheet 3 which is used to stiffen the solar cover and to attach it to the cover displacement mechanism (not shown) and which is securely joined to the combination of the cover panel 1 and plastic fame 2.

In FIG. 1, the plastic frame 2 and cover sheet 3 are formed in their area outside the cover edge such that they define a groove 4 which is open to the outside and which is used to hold a cover sealing element which is not shown. The groove 4 is formed in the plastic frame 2 by an undercut 5 and opposite the undercut by the outside edge 6 of the inner cover sheet 3. The inside edge 7 of the inner cover sheet 3 is bent to have a U-shaped cross section in FIG. 1 and a border 8 that are spaced away from the inside of the cover panel 1 such that the solar cell network 9 can extend into the area of the cover panel 1 covered by the U-shaped inside edge 7 without coming into contact with it. This means that a gap S exists between the inside edge 7 of the inner cover sheet 3 left which is at least so large that, with consideration of different coefficients of thermal expansion of the pertinent materials, under no circumstances does contact occur between the inner cover sheet 3 and the solar cell network 9. The solar cell network 9 extends, otherwise, essentially over the entire inside of the cover panel 1 as far as its edge and ends in front of the inner edge of the plastic frame 2 without being in contact with it. The bottom of the solar cell network 9 is covered by a cover film 9a.

The inner cover sheet 3 is cemented onto the bottom of the plastic frame 2 of the solar cover. This, cementing according to the embodiment of FIG. 1, calls for applying cement in the form of a cement bead 11 which is located in a recess of the plastic frame 2 which runs preferably parallel to the edge of the cover panel 1.

Figure 2:
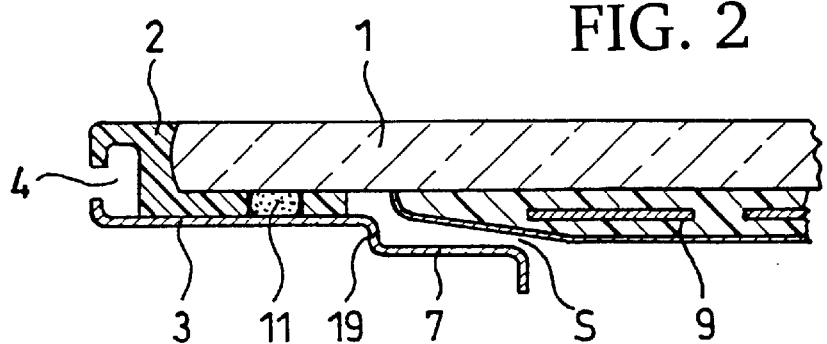
FIG. 2 is a view similar to FIG. 1 of a second embodiment of a solar cover.

FIG. 2 shows another embodiment of the solar cover in its edge area. The embodiment of FIG. 2 differs from that shown in FIG. 1 in that the inner edge 7 of the inner cover sheet 3 is not made U-shaped, but is double-stepped instead. In front of the first step or angle 19, between the inside of the inner cover sheet 3 and the inside of the cover panel 1, there is a preferably peripheral cement bead 11 by which in addition to cementing the plastic frame 2 to the cover panel 1 another attachment site for the inner cover sheet 3 is made available. Instead of the cement bead 11, in this position of the inner cover sheet 3, a seal track can also be formed from a sealing material which is designed to seal the inner cover sheet 3 relative to the cover panel 1, and not to fix the inner cover sheet on the cover panel 1. In this embodiment, between the inside edge 7 of the inner cover sheet and the solar cell network 9, a gap S is also left.

Figure 3:
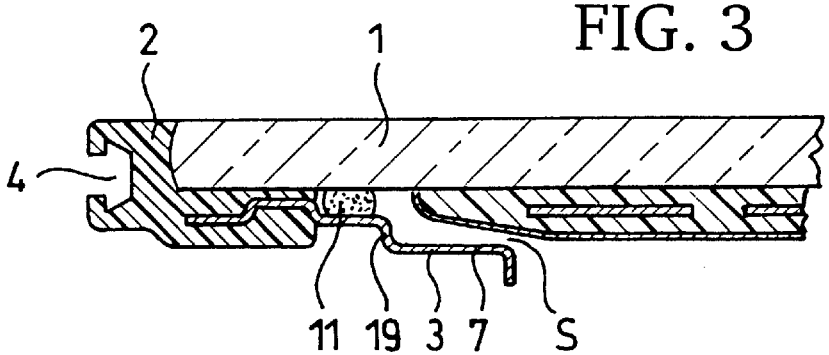
FIG. 3 is a view similar to FIG. 1 of a third embodiment of a solar cover.

FIG. 3 shows a third embodiment of the solar cover in its edge area. This embodiment largely corresponds to that shown in FIG. 2 with the differences explained below, the elements which correspond to those of FIG. 2 being labelled with the same reference numbers.

In contrast to the embodiment shown in FIG. 2, the inner cover sheet 3 is not attached on the outside of the plastic frame 2, but is integrated into it; i.e. the outer edge of the inner cover sheet 3 is embedded in the material of the plastic frame 2 ,and at that site, where the inner cover sheet 3 emerges from the plastic frame 2, there is an adhesive bead 11 or sealing cord which connects the inner cover sheet 3 to the cover panel 1 or in the case of a sealing cord, which borders the material of the plastic frame 2 to the inside during injection molding or casting.

In this embodiment of the solar cover, a peripherally externally open groove 4 is provided on the cover edge which, however, is formed exclusively in the plastic frame 2 in is case.

Figure 7:
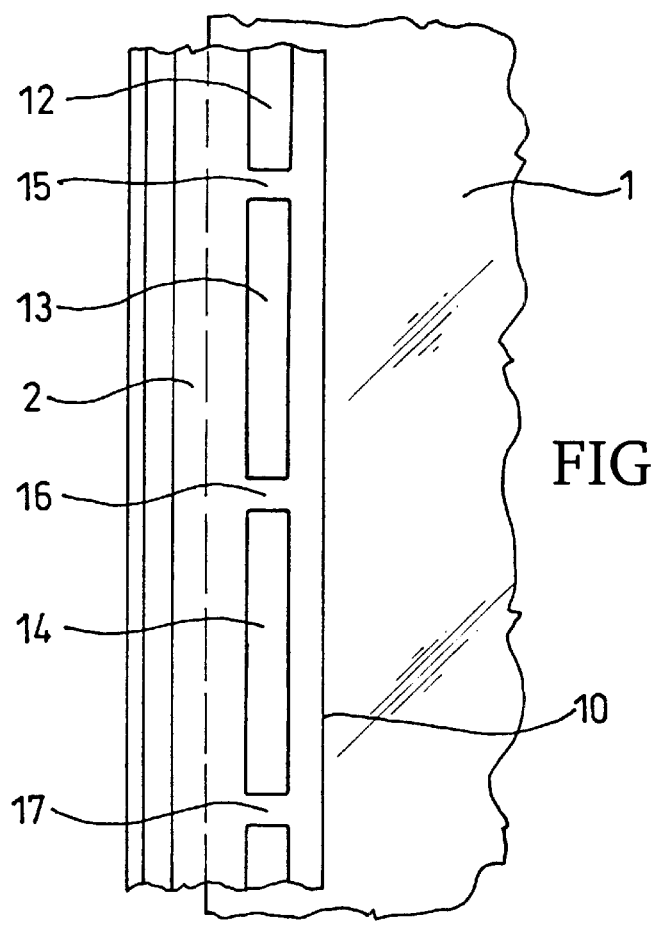
FIG. 7 shows a view of an embodiment of the solar cover in the edge area from underneath before cementing the inner cover sheet to the cover panel/plastic frame combination.

The embodiment of FIG. 4 differs from that of FIG. 1 only in the absence of cover film 9a, and the same is true for the embodiment of FIG. 5 relative to that of FIG. 2. Furthermore, the peripheral recess of the plastic frame 2 in which adhesive 11 is located, can be either a continuous recess in plastic frame 2 or can be a series of recesses that are interrupted by crosspieces, for example, as shown in FIG. 7, where three recesses 12, 13, and 14 are separated from one another by transverse crosspieces 15, 16, and 17. In this way, in the area of the inner edge 10 of the plastic frame 2 receiving spaces for adhesive are formed which ensure that the adhesive for attaching the inner cover sheet 3 to the plastic frame 2 has an optimum adhesive gap thickness in each case. On the other hand, this means that only as much area of the inside of the cover panel 1 need be covered with polyurethane as is necessary for secure joining of the plastic frame of a cover panel and for delineation of the adhesive islands in the recesses 12, 13, and 14 of the plastic frame 2.

Figure 8:
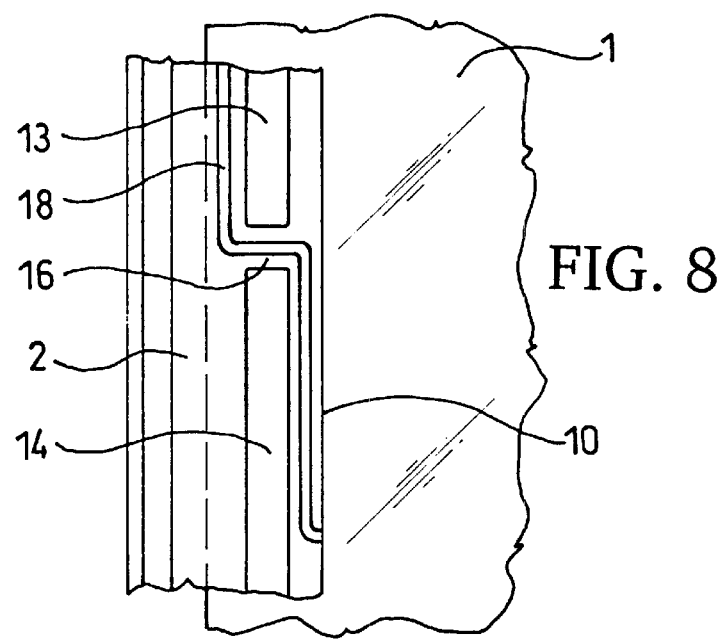
FIG. 8 is a view similar to FIG. 4 of another embodiment of the plastic frame configuration.

As shown in FIG. 8, in the area of the inner edge 10 of plastic frame 2, cable channels 18 can also be formed for routing the lines for electrical connections, for example, to the solar cell network 9. FIG. 8 shows a single channel of this type which runs in an S shape via the transverse crosspiece 16 and thus comes to lie on the outside of the recess 13 or the inside of the recess 14. In the area of the recess 14, the channel 18 opens onto the inner side of the cover panel 1 which is occupied with the solar cell network 9 in order to establish contact with the network by means of a line which is not shown and which is laid in the channel 18.

FIG. 6 shows a version of the embodiments of the solar cover as shown in FIGS. 2 or 5 at a special site which is preferably locally delimited and which is intended to hold, for example, an electronic component, for example, a DC/DC converter. For this purpose, there is a receiving space 21 for this component which is formed laterally by crosspieces 22 and 23 that are one piece with the plastic frame 2. Otherwise, the receiving space 21 is bordered by the inside of the cover panel 1 and opposite the latter by a section 24 of the inner cover sheet 3 which runs over the crosspieces 22 and 23.

Figure 9:
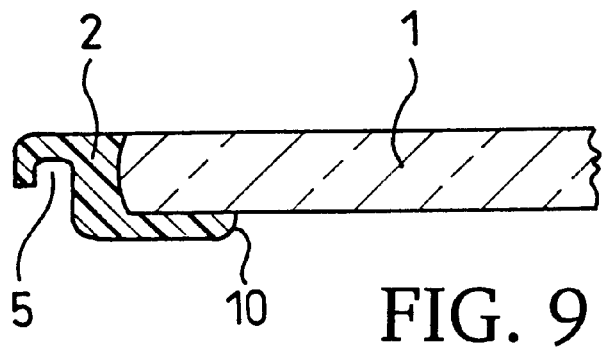
FIGS. 9 through 11 each show a schematic section of a respective alternative embodiment plastic frame for the solar cover.
Figure 10:
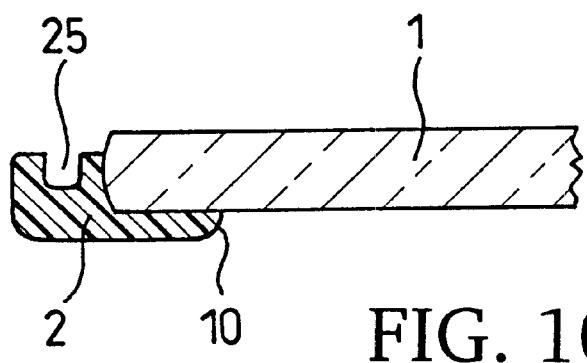
Figure 11:
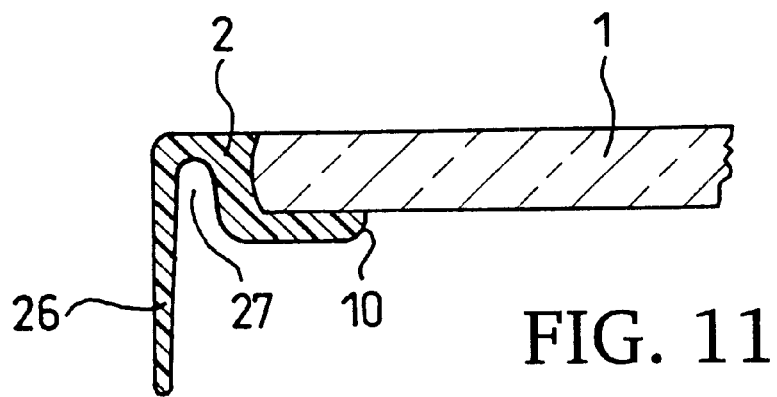

FIGS. 9 to 11 show different embodiments of the plastic frame 2 after a production step of the solar cover before the inner cover sheet 3 is cemented to it. As FIG. 9 shows, and otherwise also FIGS. 1 to 6, the plastic frame 2 can be molded flush with the top of cover panel 1 and surrounding the bottom edge area of the cover panel 1. However, alternatively, as shown in FIG. 10, the plastic frame 2 can be offset from the top of the cover panel 1, surrounding the bottom edge area of the cover panel 1. In such a case, an upwardly facing, open groove 25 is provided for holding a sealing element instead of the downwardly facing groove 5.

As FIG. 11 shows, another alternative is to have a plastic frame 2 which flushly borders the top of the cover panel 1 and has an outside screen 26 which projects below the bottom of the of the cover panel 1 and plastic frame 2, so that a groove 27 is formed between the main body of the plastic frame 2 and the screen 26.

The above described solar covers are produced such that, first of all, the plastic (polyurethane) for forming the frame 2 is molded or cast onto the edge of the cover panel 1. In the next step of the process, the solar network is laminated onto the inside of the cover panel 1. Only after this combination of the cover panel 1 and the plastic frame 2 is produced is the inner cover sheet 3 cemented to this combination, either exclusively to the plastic frame 2, preferably using the above explained adhesive islands, or alternatively, additionally by means of an additional adhesive bead 20 (FIG. 6) also to the inside of the cover panel 1.

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

I claim:

1. A Solar cover of an openable motor vehicle roof comprising a transparent cover panel, a plastic frame surrounding an edge area of the cover panel, at least in part, a solar cell network which is provided on the inside of the cover panel and which extends to near the edge area of the cover panel, and an inner cover sheet which is located in the edge area of the cover panel and which overlaps the solar cell network with its inside edge, said inner cover sheet being completely out of contact with the solar cell network with a gap existing between the inside edge of the inner cover sheet and the solar cell network so that the inner cover sheet remains completely out of contact with the solar cell network despite thermal expansion effects.

2. Solar cover as claimed in claim 1, wherein the inside edge of the inner cover sheet follows the contour of the solar cell network where the inner cover sheet extends over the solar cell network.

3. Solar cover as claimed in claim 1, wherein the inner cover sheet is joined securely by adhesive to the plastic frame.

4. A solar cover of an openable motor vehicle roof comprising a transparent cover panel, a plastic frame surrounding an edge area of the cover panel, at least in part, a solar cell network which is provided on the inside of the cover panel and which extends to near the edge area of the cover panel, and an inner cover sheet which is located in the edge area of the cover panel and which is totally out of contact with the solar cell network; wherein the inner cover sheet is securely connected by means of an adhesive to the plastic frame.

5. Solar cover as claimed in claim 4, wherein in the plastic frame is provided with at least one recess which is open in a direction towards the inner cover sheet for holding the adhesive.

6. Solar cover as claimed in claim 5, wherein an adhesive bead is applied to the inside of the cover panel inwardly from the plastic frame to join the inner cover sheet to the inside of the cover panel.

7. Solar cover as claimed in claim 5, wherein said at least one recess in the plastic frame comprises a plurality of recesses with intervening crosspieces.

8. Solar cover according to claim 7, wherein at least one channel for holding electric lines is provided in said frame extending from inside to outside of said recesses via a respective one of the crosspieces.

9. Solar cover according to claim 4, wherein at least one channel for holding electric lines is provided in said frame.

10. Solar cover as claimed in claim 4, wherein at least one local recess is provided in the plastic frame for holding electronic components.

11. Solar cover as claimed in 4, wherein a groove is formed in the plastic frame to hold a sealing element.

12. Solar cover as claimed in claim 11, wherein said groove is an undercut formed in an outer side of the plastic frame which acts together with an outer edge of the inner cover sheet for holding the sealing element.

13. Solar cover as claimed in claim 4, wherein an inside edge of the inner cover sheet overlaps the solar cell network in a contact free manner, a gap existing between the inside edge of the inner cover sheet and the solar cell network so that the inner cover sheet remains out of contact with the solar cell network despite thermal expansion effects.

* * * * *